US012573553B2

(12) United States Patent
Singh et al.

(10) Patent No.: US 12,573,553 B2
(45) Date of Patent: Mar. 10, 2026

(54) SELECTIVELY ENHANCING THE RESONANCE FREQUENCY AND QUALITY FACTOR OF ON-CHIP CAPACITORS

(71) Applicant: Dell Products L.P., Round Rock, TX (US)

(72) Inventors: Tejinder Singh, Kanata (CA); Navjot Kaur Khaira, Kanata (CA)

(73) Assignee: Dell Products L.P., Round Rock, TX (US)

( * ) Notice: Subject to any disclaimer, the term of this patent is extended or adjusted under 35 U.S.C. 154(b) by 68 days.

(21) Appl. No.: 18/519,346

(22) Filed: Nov. 27, 2023

(65) Prior Publication Data

US 2025/0174399 A1 May 29, 2025

(51) Int. Cl.
H01G 4/012 (2006.01)
G01R 27/26 (2006.01)
(Continued)

(52) U.S. Cl.
CPC ......... H01G 4/012 (2013.01); G01R 27/2605 (2013.01); H01G 4/33 (2013.01); H03H 7/18 (2013.01); H03H 7/38 (2013.01)

(58) Field of Classification Search
None
See application file for complete search history.

(56) References Cited

U.S. PATENT DOCUMENTS

| | | | |
|---|---|---|---|
| 5,925,921 A | 7/1999 | Susak | |
| 6,410,954 B1 * | 6/2002 | Sowlati | H10D 84/212 |
| | | | 257/E21.018 |

(Continued)

FOREIGN PATENT DOCUMENTS

| | | |
|---|---|---|
| WO | 2006/039699 | 4/2006 |

OTHER PUBLICATIONS

Irwin, et al., "Basic Engineering Circuit Analysis", New York: John Wiley & Sons, Inc., 2002, pp. 1-432.

(Continued)

*Primary Examiner* — Timothy J. Dole
*Assistant Examiner* — Esther N Lian
(74) *Attorney, Agent, or Firm* — Amin, Turocy & Watson, LLP

(57) ABSTRACT

The technology described herein is directed towards a capacitor with a modified design (relative to standard capacitors), in which a first conductor is coupled to a second conductor via a distributed array of conducting interconnects through a dielectric that separates the conductors. The array of interconnects facilitates electrical surface current flow between the first conductor and the second conductor, and determines the self-resonant frequency of the capacitor. The array (or enlarged area) of conducting interconnects, not present in standard capacitors, results in capacitors with larger self-resonant frequency, e.g., having a substantially stable capacitance over a range of high radio frequencies, including millimeter wave frequencies. This further provides an improved quality factor. The improvements resulting from the technology described herein facilitate more optimal surface current density. The modified capacitor provides benefits in various circuits, e.g., in an impedance or a millimeter wave frequency phase shifter for antenna elements.

20 Claims, 11 Drawing Sheets

(51) Int. Cl.
  *H01G 4/33*        (2006.01)
  *H03H 7/18*        (2006.01)
  *H03H 7/38*        (2006.01)

(56)                References Cited

U.S. PATENT DOCUMENTS

|  |  |  |  |  |
|---|---|---|---|---|
| 9,875,848 | B2 | 1/2018 | Berdy et al. | |
| 2004/0080023 | A1 | 4/2004 | Ueda | |
| 2007/0278551 | A1* | 12/2007 | Anthony | H01L 23/5223 |
|  |  |  |  | 257/307 |
| 2014/0103489 | A1 | 4/2014 | Dirnecker et al. | |
| 2015/0179731 | A1 | 6/2015 | Lasiter et al. | |
| 2015/0295020 | A1 | 10/2015 | Tseng et al. | |
| 2015/0318107 | A1* | 11/2015 | Hecht | H01F 27/40 |
|  |  |  |  | 361/270 |
| 2020/0211955 | A1 | 7/2020 | Rubin et al. | |
| 2021/0265116 | A1 | 8/2021 | Aburakawa et al. | |
| 2023/0187479 | A1 | 6/2023 | Tu et al. | |
| 2023/0307185 | A1* | 9/2023 | Voiron | H10D 1/043 |
| 2023/0352396 | A1* | 11/2023 | Hsiao | H01G 4/33 |

OTHER PUBLICATIONS

Irwin, et al., "Basic Engineering Circuit Analysis", New York: John Wiley & Sons, Inc., 2002, pp. 433-831.

Robbins, et al., Circuit Analysis: Theory and Practice, 5th ed., Cengage Learning, 2012, pp. 554-558.

Hughes, et al., "Hughes Electrical and Electronic Technology," 11th ed., Pearson, 2012, pp. 237-241.

Glisson, "Introduction to Circuit Analysis and Design," Springer, 2011, pp. 1-388.

Glisson, "Introduction to Circuit Analysis and Design," Springer, 2011, pp. 389-768.

Singh, et al., "Monolithically Integrated Reconfigurable RF MEMS Based Impedance Tuner on SOI Substrate," in 2019 IEEE MTT-S International Microwave Symposium (IMS), doi:10.1109/mwsym.2019.8701106.

Singh, et al., "Thermally Actuated SOI RF MEMSBased Fully Integrated Passive Reflection-Type Analog Phase Shifter for mmWave Applications," IEEE Transactions on Microwave Theory and Techniques, (2020)1-1. doi:10.1109/tmtt.2020.3018141.

Singh, et al. "Enhancing the Quality Factor of Planar Capacitors Without Impacting the Resonance Frequency" U.S. Appl. No. 18/669,888, filed May 21, 2024, 38 pages.

International Search Report and Written Opinion mailed Sep. 2, 2024 for PCT Application No. PCT/US2024/013895, 16 pages.

Wen Jia-Ming et al: "Fabrication and Characteristics of Aluminum Oxide MIM Capacitors with Interconnections using BCB-based MEMS Technology", 2020 International Conference on Microwave and.Millimeter Wave Technology {ICMMT), IEEE, Sep. 20, 2020, 3 pages.

Motlagh Bm et al: "High-Q fringing-field-enhanced capacitors {FFE) for deep submicron Silicon-MMICs" Microwave Conference, 2004. 34th European Amsterdam, The Netherlands, Piscataway, NJ, USA,IEEE, Oct. 14, 2004, 4 pages.

Office Action mailed Nov. 28, 2025 for U.S. Appl. No. 18/669,888, 56 pages.

* cited by examiner

633a

620

632a

633b

633c

621

632b

633d

SELECTIVELY ENHANCING THE RESONANCE FREQUENCY AND QUALITY FACTOR OF ON-CHIP CAPACITORS

BACKGROUND

Capacitors are fundamental circuit elements in many electronics and electrical applications, including automotive, consumer electronics, biomedical, defense, satellites, and wireless communications. In high-frequency wireless communications, including fifth generation (5G), sixth generation (6G) and beyond, features such as massive machine-type communications (mMTC) and ultra-reliable low-latency communication (URLLC) are highly desirable. Examples of machine-to-machine (M2M) use cases can include time-sensitive industrial IoT (IIoT) applications, autonomous vehicles, sophisticated drone systems, and asset tracking systems. These applications need improved passive components, notably capacitors and inductors.

Presently, commercial high-frequency capacitors serve sectors from 1 gigahertz (GHz) to 4 GHz, encompassing cellular bases, mobile phones, and 4G infrastructures. High-frequency capacitors are limited by their resonant frequencies, making them less effective beyond their self-resonant frequencies, generally because a capacitor's capacitance value increases exponentially while approaching its first self-resonant frequency, (and behaves like an inductive element above the capacitor's self-resonant frequency). Another design consideration is the quality factor (Q-factor) of a capacitor, which in general represents the efficiency of the capacitor in terms of energy loss; that is, the Q-factor of a capacitor is a measure of how lossless the capacitor is. In general, increasing the self-resonant frequency results in a concomitant rise in the Q-Factor, and vice versa. The Q-factor is inversely proportional to the frequency and thus gets worse at higher frequencies, which, like the self-resonant frequency, limits a capacitor's operational frequency.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
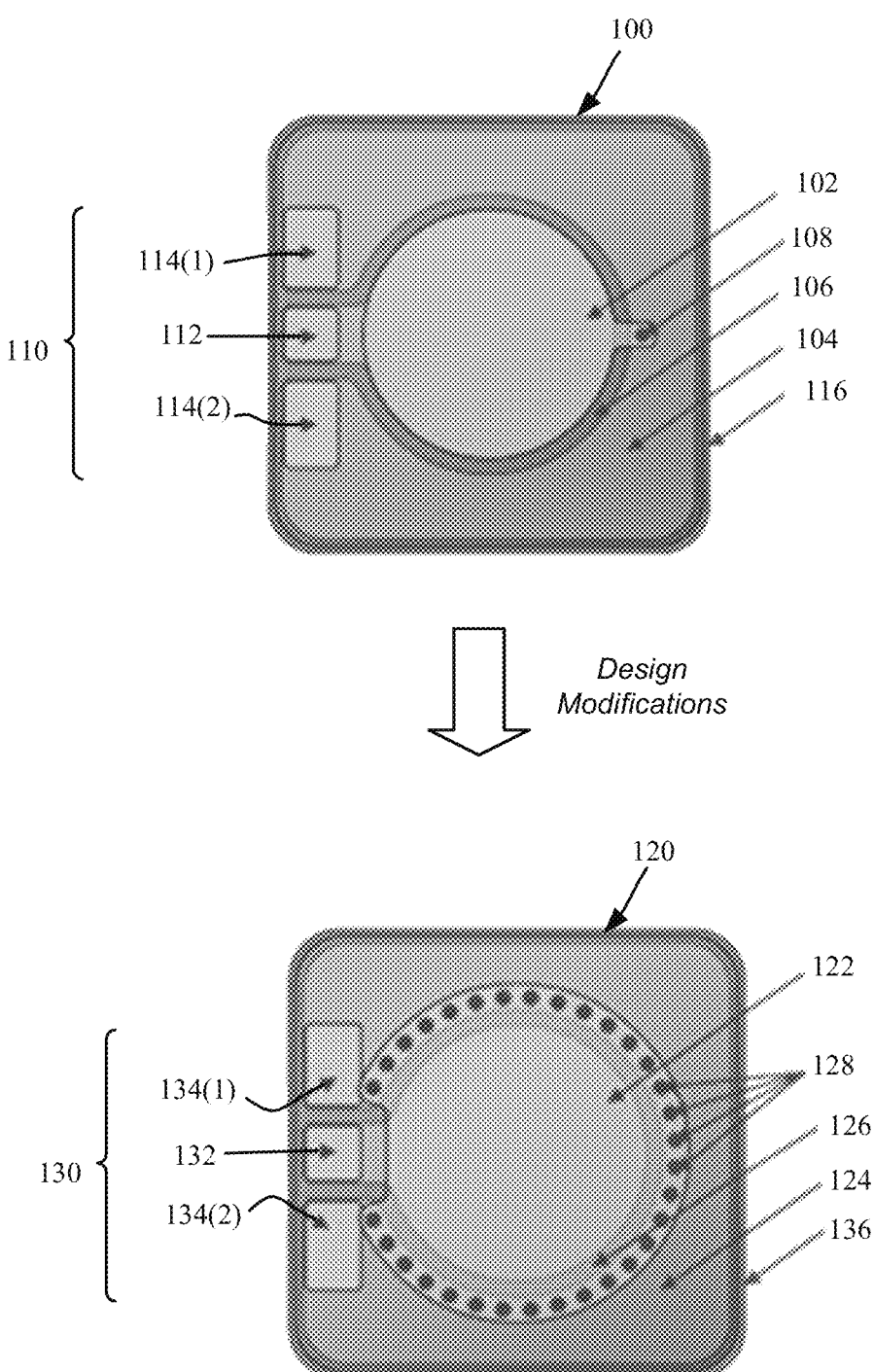
FIG. 1 comprises top view representations of an example capacitor, including a modified capacitor having a distributed array of conducting interconnects along the device periphery (in contrast to a conventional capacitor), in accordance with various aspects and implementations of the subject disclosure.

Various aspects of the technology described herein are generally directed towards metal-insulator-metal (MIM) capacitors that improve the self-resonant frequency and Q-factor while keeping the capacitance value constant, including at ultra-high-frequencies. In general, MIM capacitors can provide high capacitance in compact footprints, and can be seamlessly integrated onto printed circuits or on-chip using dual metal layers.

As will be understood, the technology described herein is based on straightforward design changes rather than proposing a new/complicated method of manufacturing on-chip MIM capacitors. To this end, described herein is a capacitor design that not only makes the Q-factor of planar capacitors more optimal, maintaining their value, but does so while simultaneously increasing the resonant frequencies of capacitors. In general, an array of interconnects (e.g., vias) facilitate electrical surface current flow between the capacitor's conductors and thereby determine the capacitor's self-resonant frequency and Q-factor. By carefully and/or selectively arranging the interconnects, the capacitor's self-resonant frequency and Q-factor can be made more optimal for a given application. As will be understood, in one or more implementations, capacitor design is evolved to bypass the need for intricate manufacturing alterations, and thus can transform 5G-advanced, mmWave, 6G radios, and beyond, as well as transforming the forthcoming wave of consumer electronics, including, but not limited to, consumer devices such as notebooks and IoT devices.

It should be understood that any of the examples herein are non-limiting. Thus, any of the embodiments, aspects, concepts, structures, functionalities or examples described herein are non-limiting, and the technology may be used in various ways that provide benefits and advantages in communications and computing in general. It also should be noted that terms used herein, such as "optimize" or "optimal" and the like only represent objectives to move towards a more optimal state, rather than necessarily obtaining ideal results.

Reference throughout this specification to "one embodiment," "an embodiment," "one implementation," "an implementation," etc. means that a particular feature, structure, or characteristic described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

Aspects of the subject disclosure will now be described more fully hereinafter with reference to the accompanying drawings in which example components, graphs and/or operations are shown. In the following description, for purposes of explanation, numerous specific details are set forth in order to provide a thorough understanding of the various embodiments. However, the subject disclosure may be embodied in many different forms and should not be construed as limited to the examples set forth herein.

The following detailed description is merely illustrative and is not intended to limit embodiments and/or application or uses of embodiments. Furthermore, there is no intention to be bound by any expressed or implied information presented in the preceding sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures, substrate materials and process features, and steps can be varied within the scope of the present disclosure.

It will also be understood that when an element such as a layer, region or substrate is referred to as being "on" or "over" another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment," as well any other variations, appearing in various places throughout the specification are not necessarily all referring to the same embodiment. Repetitive description of like elements employed in respective embodiments is omitted for sake of brevity.

In general, capacitors are electronic circuit elements that store an electrical charge. Capacitors are basically conductive metal plates separated by an insulator (dielectric). The capacitance, or amount of charge held by the capacitor per applied voltage, depends on parameters including the area of the plates, the distance between the plates, and the dielectric constant value of the insulator layer between the plates. Capacitors are used in a variety of devices such as filters, analog-to-digital converters, memory devices, control applications, high frequency electronics and many other types of electronic circuits. Radio frequency (RF) circuits have associated capacitive elements, as at high frequencies capacitive and inductive effects become more prominent relative to direct current or low frequencies.

One type of capacitor is a metal-insulator-metal (MIM) capacitor, which is frequently used with circuits needing high capacitance in a small area. MIM capacitors are developed using two layers of a printed circuit board (PCB) or similar material stack, utilizing the dielectric layer between as the dielectric insulator.

In electrical circuits, reactance is the opposition presented to alternating current by inductance or capacitance; reactance is similar to resistance but differs in that reactance does not lead to dissipation of electrical energy as heat, but instead stores energy which is returned to the circuit a quarter cycle later. As frequency increases, inductive reactance increases and capacitive reactance decreases.

With high frequency circuits such as for 5G, millimeter wave (mmWave) or sub-terahertz (sub-THz, between 90 and 300 gigahertz, typically beyond 100 gigahertz) frequencies, the capacitive reactance and its relationship with the increasing frequency are significant considerations. Capacitive reactance, $X_C$, in ohms ($\Omega$) is given by:

$$Xc = -\frac{1}{\omega C} = -\frac{1}{2\pi f C}$$

where, f is the frequency in hertz (Hz), and C is the capacitance in farads (F). The impedance of a capacitor is given by $C=-jX_c$.

At f=0, the magnitude of the capacitor's reactance is infinite, behaving like an open circuit and thus preventing any current from flowing through the dielectric. As frequency increases, the magnitude of reactance decreases, allowing more current to flow. As f approaches infinity, the capacitor's reactance approaches 0, behaving like a short circuit.

Inductive reactance is a property exhibited by an inductor, in which an electric current produces a magnetic field around an inductor. In the context of an alternative current circuit, the magnetic field is constantly changing because of the oscillating current. The change in the magnetic field induces another electric current to flow in the same wire, in a direction such as to oppose the flow of current originally responsible for producing the magnetic field. Hence, inductive reactance is an opposition to the change of current through an element.

Inductive reactance $X_L$ is proportional to the sinusoidal signal frequency f and the inductance L, which depends on the physical shape of the inductor and is given by:

$$X_L = \omega L = 2\pi f L$$

The quality factor, or simply the Q-factor or Q is a parameter that describes the resonance behavior of an underdamped harmonic oscillator or resonator. Sinusoidally driven resonators having higher Q-factors resonate with greater amplitudes at resonant frequency, but have a smaller range of frequencies around that frequency at which they resonate; the range of frequencies for which the oscillator resonates is called the bandwidth. Thus, a high-Q tuned circuit in a radio receiver is more difficult to tune but has more selectivity, whereby it does a better job of filtering out signals from other stations that lie nearby on the spectrum. High-Q oscillators oscillate with a smaller range of frequencies and are more stable.

In real circuits, resistance cannot be avoided. All conductors at room temperature such as aluminum, copper, gold, platinum, tungsten, etc., have finite conductivity except superconductors, which have near zero resistance at cryogenic temperatures (near zero still means minimal resistance but not completely zero). A capacitor or inductive element when implemented in a circuit has small effective resistance R associated within. The Q-factor of a capacitor at the operating frequency f is defined as the ratio of the reactance of the capacitor to its series resistance.

The Q-factor of a capacitor represents the efficiency of a given capacitor in terms of energy losses or in short, the Q of a capacitor is a measure of how lossless a capacitor is and is given by:

$$Q = \frac{X_C}{R_C} = \frac{1}{2\pi f C R_C}$$

where, f is frequency (Hz), C is capacitance in farads, $X_C$ is reactance of the capacitor in ohms, and $R_C$ is the equivalent series resistance (ESR) of the capacitor in ohms. With increasing frequency, the Q-factor decreases (gets worse). For example, in an ideal scenario, a 1 picofarad (pF) capacitor with 0.1 ohms resistance would have a Q value of 159 at 10 GHz; however, in practice, the design of a capacitor, processing technology, material purity, contamination and so forth can deteriorate the Q-factor significantly.

In an alternating current system, the Q-factor represents the ratio of energy stored in the capacitor to the energy dissipated as thermal losses in the equivalent series resistance. For example, a capacitor that can store 2,000 joules of energy while wasting only 1 joule has a Q-factor of 2,000. Because Q is the measure of efficiency, an ideal capacitor would have an infinite value of Q meaning that no energy is lost at all in the process of storing energy. This is derived from the fact that the equivalent series resistance of an ideal capacitor equals zero.

The Q-factor is not a constant value, but rather changes significantly with frequency. One reason is the clear $2\pi f$ term in the above equation; another is that equivalent series resistance is not a constant value with respect to frequency. The equivalent series resistance varies with frequency due to the well-known skin effect, in which current tends to flow around the outer edge of a conductor, as well as other effects related to the dielectric characteristics.

Lower frequency applications do not have to take the Q-factor into consideration, and standard capacitors may be used in those applications. However, the Q-factor is a significant capacitor characteristic in the design of RF circuits. At RF frequencies, the equivalent series resistance increases with frequency due to the skin effect. Along with the increase in equivalent series resistance, dissipative losses increase as well. Therefore, RF circuits typically use high-Q capacitors to reduce high-frequency losses. Q-factor considerations become even more significant when designing circuits for 5G and mmWave applications.

Further, the self-resonance of a capacitor imposes a frequency limit where a capacitor acts as true capacitive reactance to the circuit. After the resonance point, the impedance rotates, and the capacitor starts to act as an inductive element. Note that in practice, a real capacitor is actually a series RLC (resistor-inductor-capacitor) circuit, and the resonance frequency can be estimated if the leakage resistance, equivalent series resistance, and equivalent series inductance (ESL) are known. Capacitors and inductors have multiple self-resonant frequencies over increasing frequency, which depends on the construction, type, value, and integration method. SRF is thus a significant parameter to consider when designing capacitors for 5G/mm Wave applications and it becomes increasingly difficult to develop circuits for 6G and Sub-THz applications due to the self-resonant frequency of the elements.

Typically, the self-resonant frequency of a capacitor fits a downward, generally straight line on a log-log scale when the self-resonant frequency is plotted against capacitance value. As a result, for example, to develop 5G FR1 radios operating under 6 GHz, the capacitors need to be designed with SRF way beyond 6 GHz, as capacitor value increases exponentially while approaching its first SRF.

Figure 2:
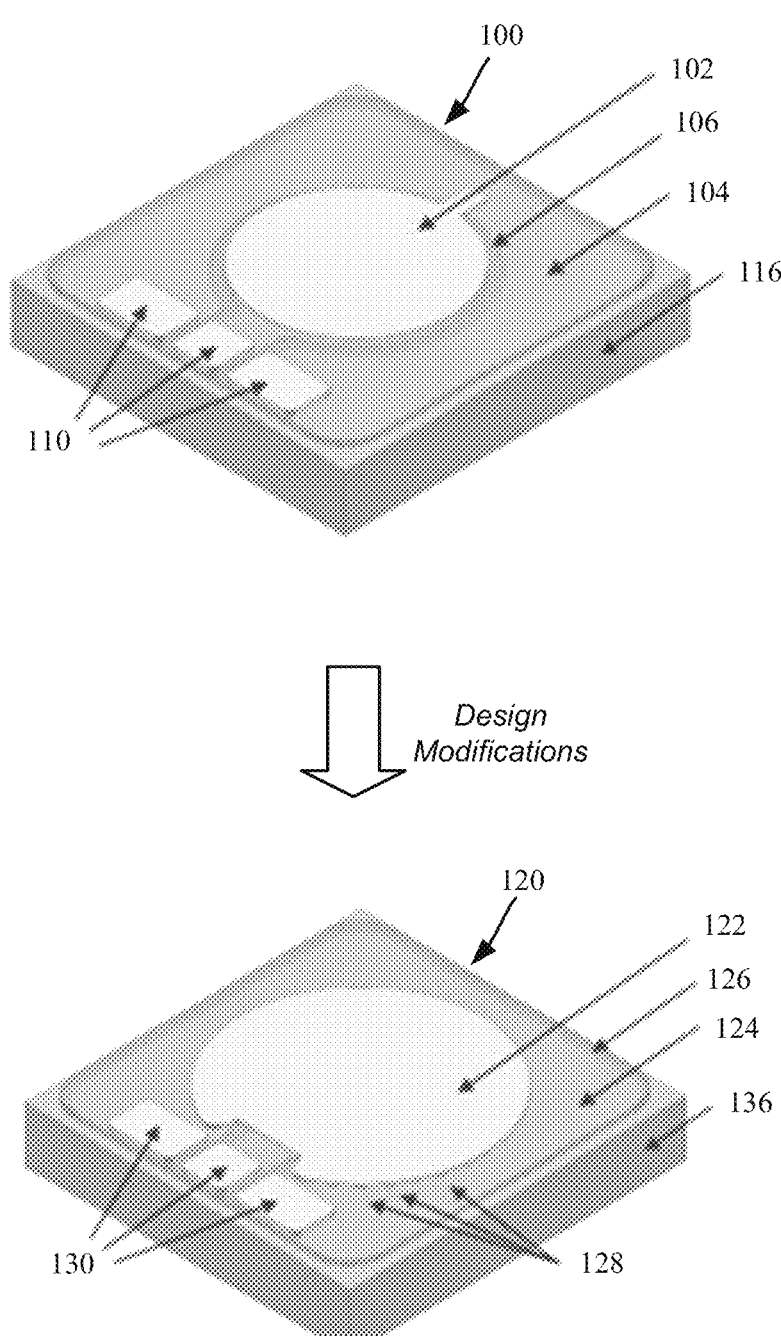
FIG. 2 shows perspective view representations of the example capacitors of FIG. 1, in accordance with various aspects and implementations of the subject disclosure.

As shown in the upper portion of FIG. 1 (top view) and FIG. 2 (perspective view), a conventional metal-insulator-metal capacitor 100 is constructed by two overlapping conductors 102 and 104 with a dielectric 106 (also referred to as an insulator medium) in between. Various parameters dictate the capacitance value including dielectric thickness, dielectric constant or permittivity and the overlapping area of metal conductors.

A single metal interconnect 108 facilitates a small current flow via between the conductors 102 and 104 Note that the RF ports (collectively 110) includes an RF signal port 112 and RF ground port(s) 114(1) and 114(2). For purposes of measurement and device integration, a coplanar waveguide (CPW) port design is utilized in which the RF signal port and RF ground ports are both on the same plane. The coplanar waveguide implementation does not rely on material thickness, which is standard in microstrip implementations.

A substrate 116 is underneath the other components. Note that while a capacitor's self-resonant frequency can be improved by using vertically stacked capacitors, (which is not possible in various PCB or microfabrication processes), the RF also can be improved by removing the substrate underneath the device; in general, however, this makes the device unreliable.

Figure 3:
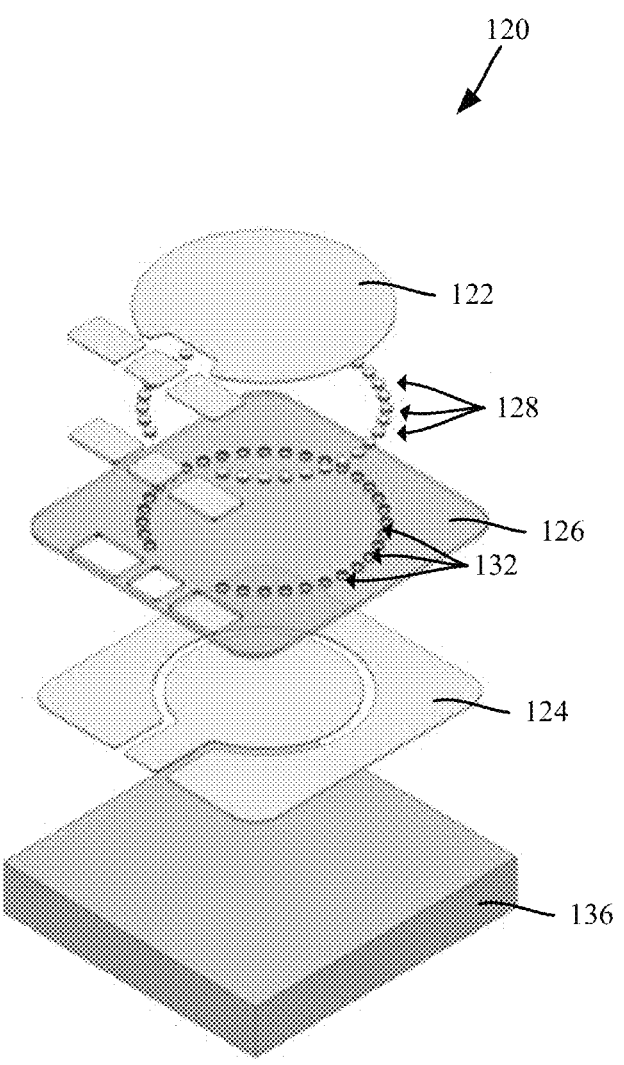
FIG. 3 shows an exploded view of a modified capacitor having a distributed array of conducting interconnects along the device periphery, in accordance with various aspects and implementations of the subject disclosure.

The technology described herein, represented in the lower portion of FIG. 1, is based on design modifications that result in a metal-insulator-metal capacitor 120 that significantly improves the self-resonant frequency and Q-factor (relative to the conventional metal-insulator-metal capacitor 100), including by distributing the interconnects 128 around the desired overlap area periphery of the two overlapping conductors 122 and 124 with a dielectric 126. This is also shown in the lower portion of FIG. 2 (perspective view) and FIG. 3 (exploded view). FIG. 3 also shows the vias 132 through the dielectric medium 126. In the lower portions of FIGS. 1 and 2, similar RF ports (collectively 130) include an RF signal port 132 and RF ground port(s) 134(1) and 134(2), and a substrate 136 is similarly underneath the other components. Note that in general, this capacitor design is independent of dielectric thickness, permittivity, and/or overlapping area.

In general, the technology described herein concurrently enhances the Q-factor and self-resonance frequency (SRF) of planar capacitors, resulting in augmented flexibility in RF component optimization. In one or more implementations, the technology can be based on only some straightforward layout-level modifications, without, for example, extensive changes to manufacturing processes or the introduction of new materials. By selective alteration of interconnects around the device's periphery, such as by adjusting the desired number/placement of these interconnects, the overall interconnect area facilitates electrical surface current flow between the first conductor and the second conductor, and thereby provide significant improvements in Q-factor and SRF. The design principle of the technology described herein is applicable to virtually all MIM capacitors, regardless of their geometry, and can seamlessly transition to multi-layer structures.

As will be understood, straightforward design modifications at the circuit design level facilitate the development of miniaturized high-performance monolithic metal-insulator-metal capacitors with high capacitance values, regardless of material stack change or any heterogeneous integration using vendor components. With this design modification during circuit design, the self-resonant frequency can be pushed far beyond the operational band of interest with simultaneous Q-factor improvement, while not being dependent on choice of materials. The technology described herein is thus based on design modification(s), and significantly can be accomplished with no modification required on the fabrication or manufacturing side.

More particularly, one or more implementations of the technology described herein is based on straightforward design modifications, including extending the top conductor electrode 122 to cover a portion of the RF ground plane using the top conductor electrode 122 122 as shown in FIGS. 1-3. Note that this is in contrast to traditional or standard MIM capacitors, which are designed by overlapping the top conductor electrode only on top of the required capacitive area as generally represented in the top portions of FIGS. 1 and 2.

As described herein and further highlighted in FIG. 3, another straightforward design modification is the distributing of the vias 132 between the top conductor layer 122 and bottom conductor layer 124 alongside the periphery of the RF ground plane. As set forth herein, this is in contrast to a traditional or standard MIM capacitor shown that is implemented using only a single interconnect 108 (the upper portion of FIG. 1).

Figure 4A:
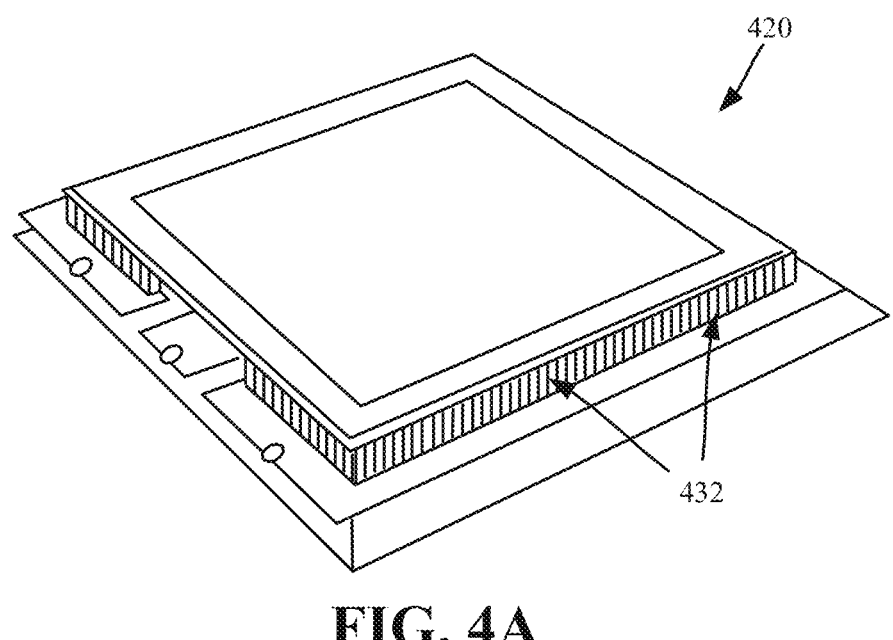
FIG. 4A is a three-dimensional representation of a modified, rectangular capacitor having a distributed array of conducting interconnects along the device periphery, in accordance with various aspects and implementations of the subject disclosure.
Figure 4B:
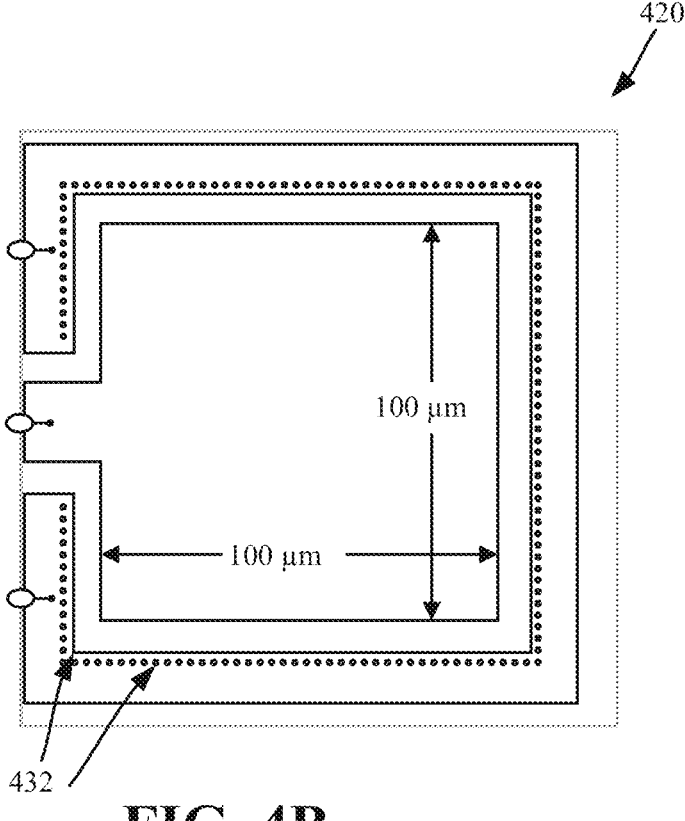
FIG. 4B is a top view model representation of the modified, rectangular capacitor of FIG. 4A having a distributed array of conducting interconnects along the device periphery, in accordance with various aspects and implementations of the subject disclosure.

As can be readily appreciated, the design modifications can be used with any arbitrary shape of MIM capacitor, not only a circular overlapping area but other shapes, e.g., rectangular. For example, FIGS. 4A and 4B show a perspective view and top view representation of an example rectangular MIM capacitor 440 with any number of interconnects 432. As shown in FIG. 4B, in one implementation the overlapping area can be 100 μm×100 μm, such as with, for example, a 60-nanometer interconnect ring and dielectric. Material parameters can include 3 μm gold (Au) for the upper and lower conductors, and silicon nitride (SiNx) for the dielectric. Further, the technology described herein can be used on standard two-layer MIM capacitors that include two metal conductor electrodes, as well as in multilayer MIM capacitors, which can potentially include multiple metal conductor layers (e.g., a third conductor and a second insulator) to reduce the overall area of the device.

Figure 5A:
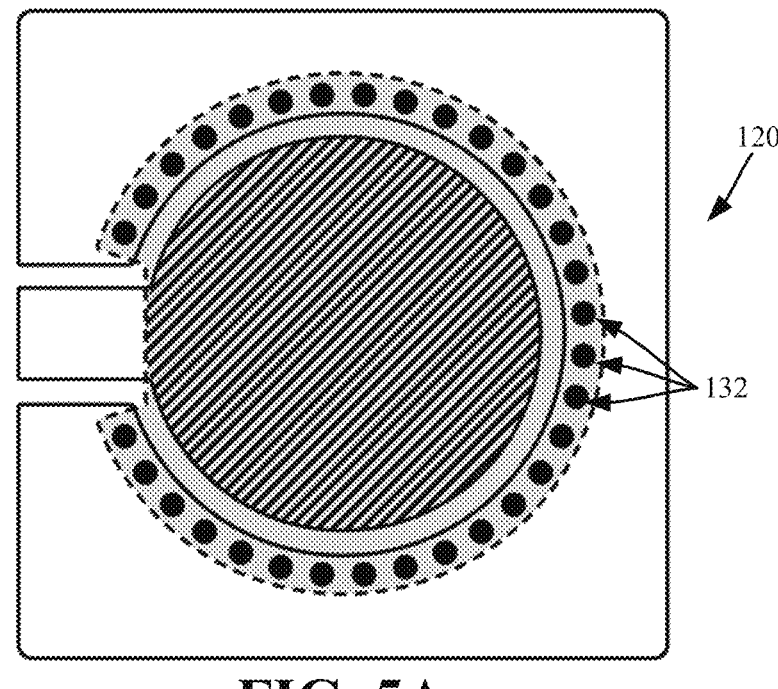
FIG. 5A is top view representation of a modified capacitor having an array of conducting interconnects along a large percentage of the device periphery in a general ring shape, in accordance with various aspects and implementations of the subject disclosure.
Figure 5B:
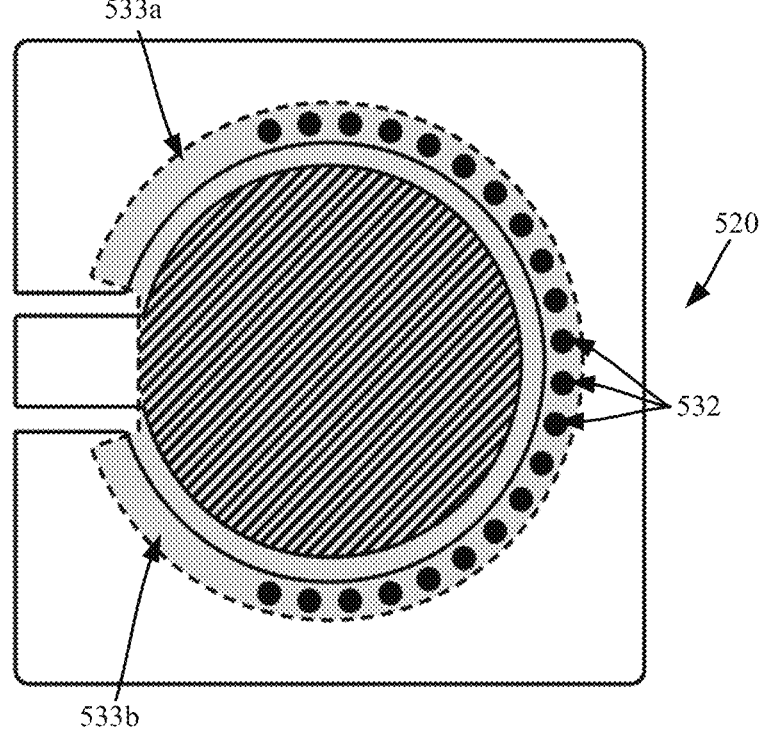
FIG. 5B is top view representation of a modified capacitor having an array of conducting interconnects along more than half of the device periphery, in accordance with various aspects and implementations of the subject disclosure.

FIG. 5A is a simplified top view of the capacitor 120 shown in FIG. 3. FIG. 5B is a similar view a different capacitor design 520; note that the number of interconnects is reduced relative to FIG. 5A, resulting in less total area (approximately seventy-five percent) for facilitating current flow between the conductors. This is emphasized by the areas 533a and 533b that do not have any interconnects.

Figure 6A:
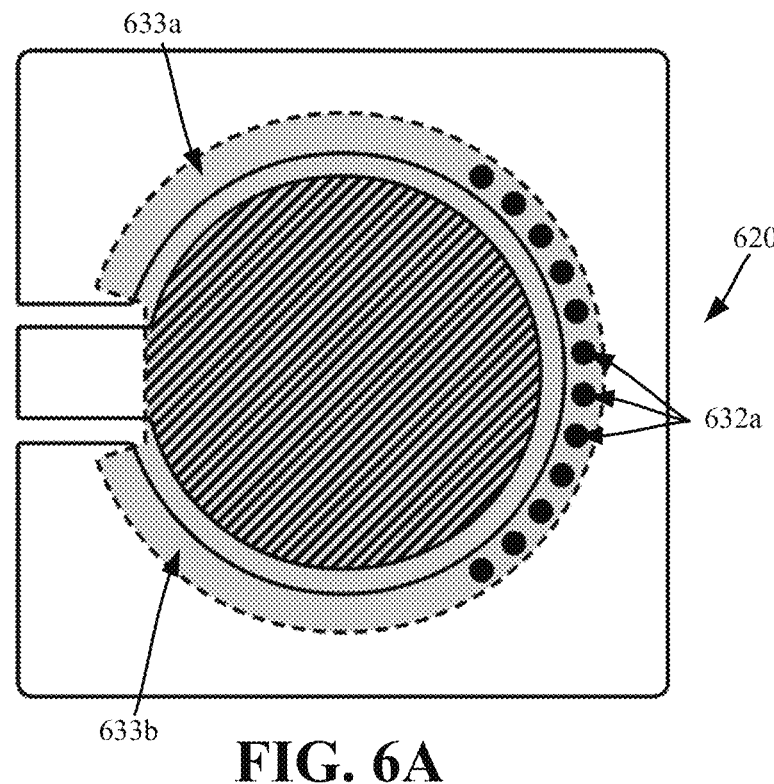
FIG. 6A is top view representation of a modified capacitor having an array of conducting interconnects along less than half of the device periphery, in accordance with various aspects and implementations of the subject disclosure.

FIG. 6A is another different capacitor design 620 having interconnects 632a with still less total interconnect area (approximately forty percent) for facilitating current flow between the conductors. This is emphasized by the larger areas 633a and 633b that do not have any interconnects. FIG. 6D shows a design of a capacitor 621 with only two interconnects 632b, with large non-interconnect areas 633c and 633d; as is understood, the design in FIG. 6D approaches the traditional design as shown in the upper portions of FIGS. 1 and 2, and as expected, has less SRF/Q-factor improvement as described with reference to FIGS. 10 and 11.

Figure 7:
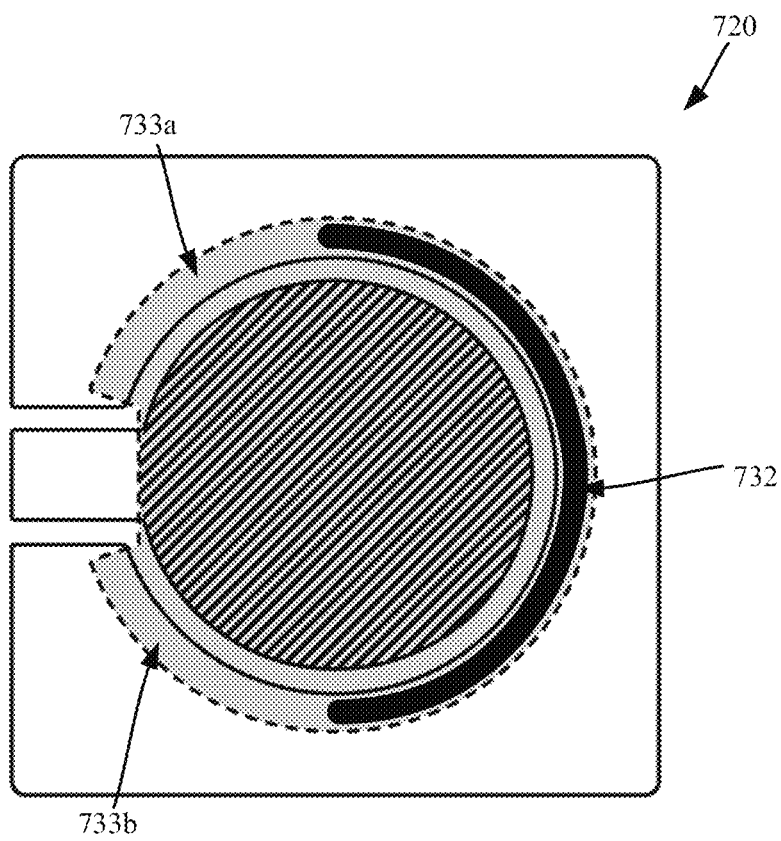
FIG. 7 is top view representation of a modified capacitor having a single conducting interconnect extending across approximately half of the device periphery, in accordance with various aspects and implementations of the subject disclosure.

It should be noted that although a distributed array of interconnects is a straightforward design to implement so as to obtain desirable SRF/Q-factor characteristics, other designs can provide desirable results. For example, FIG. 7 shows a single interconnect 732 that covers a large area with respect to current flow between the conductors; as is understood this area (of the single interconnect 732) can be enlarged while shrinking the non-interconnect areas 733a and 733b, or reduced while enlarging the non-interconnect areas 733a and 733b.

It is also noted that the positions of the interconnect or interconnects can be moved, although centering the interconnects generally opposite the RF ports (centered at 180-degrees) provides desirable results. Also interconnects need not be symmetrically distributed, and/or there can be gaps between interconnects rather than having them evenly distributed.

Figure 6B:
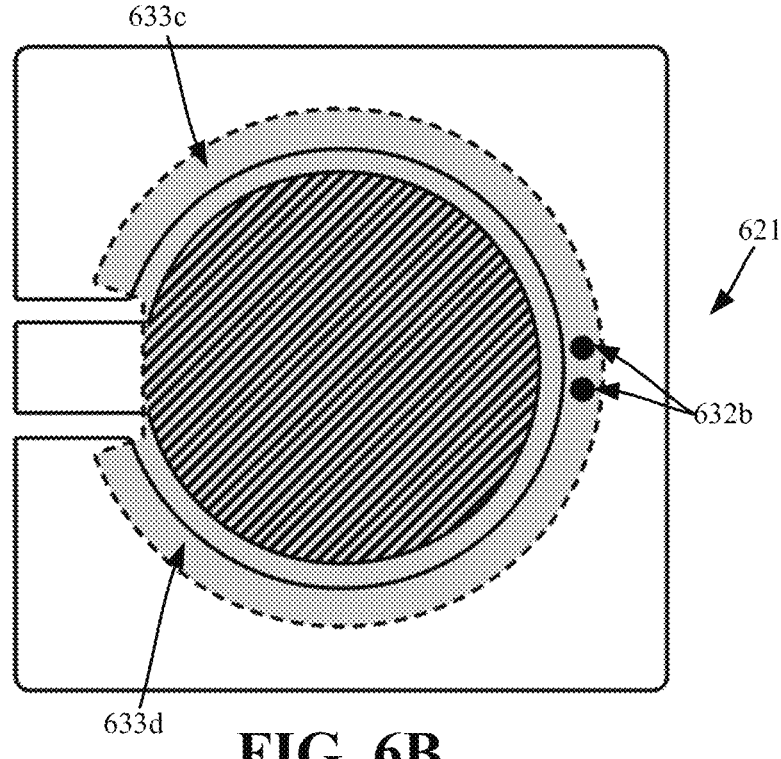
FIG. 6B is top view representation of a capacitor having conducting interconnects opposite radio frequency ports, in accordance with various aspects and implementations of the subject disclosure.

To summarize, the straightforward design changes in percentage of interconnects connected between the two metal planes as shown in FIGS. 5A, 5B and 6A are varied, each connected starting from the opposite side of the RF port (180-degrees). The design of FIG. 5A has interconnects covered around the top metal plane and provides maximum SRF and Q-factor enhancement, whereas the designs of FIGS. 5B and 6A have partial coverage (approximately seventy-five percent and forty percent) respectively, and demonstrate the impact of such a simple design change. The design of FIG. 6B is close to a typical a traditional MIM capacitor design as described herein.

Figure 8:
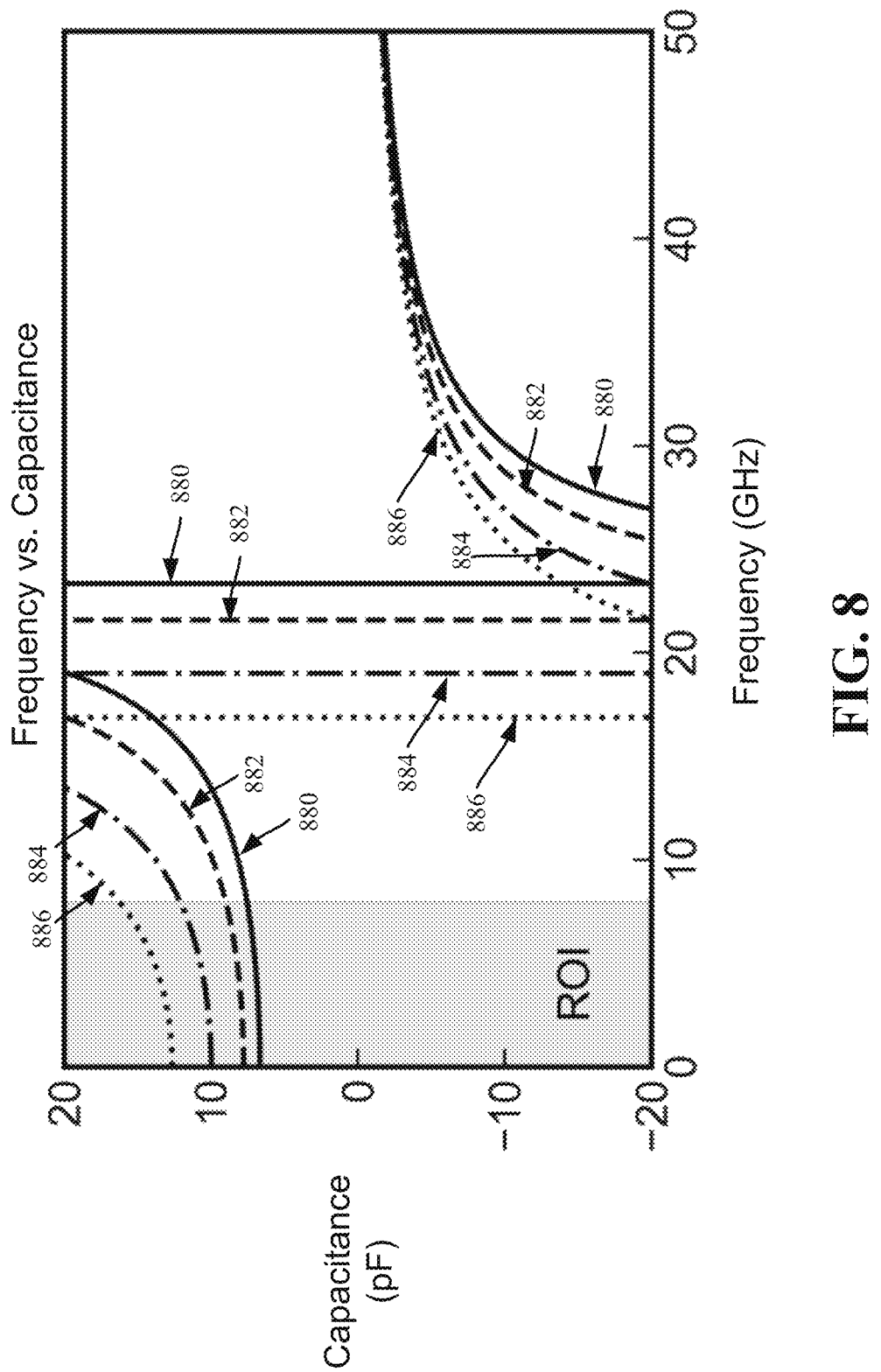
FIG. 8 is an example graph of capacitance versus frequency for example capacitive devices of differing characteristics, in accordance with various aspects and implementations of the subject disclosure.
Figure 9:
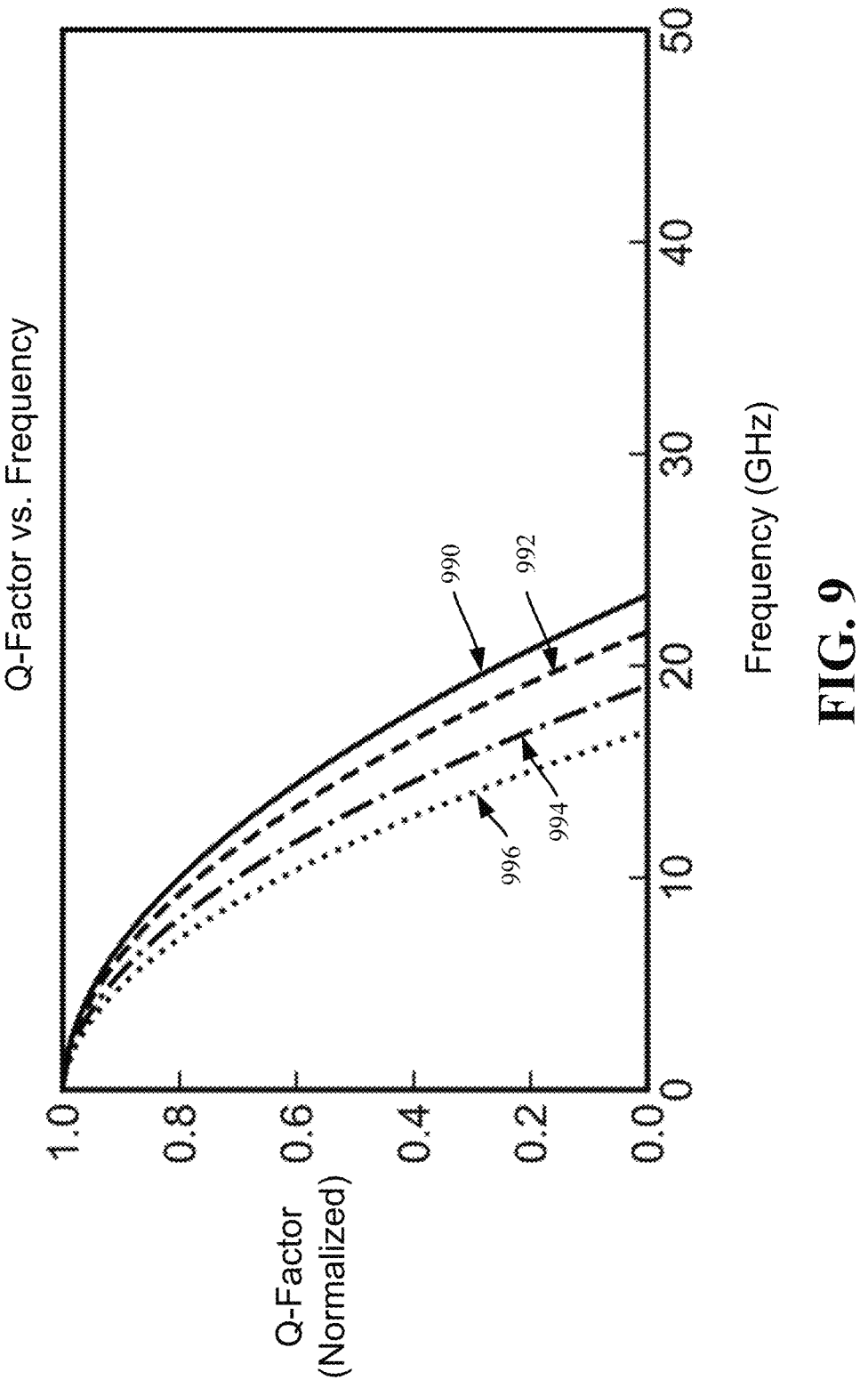
FIG. 9 is an example graph of quality factor (Q-factor) versus frequency for the example capacitive devices corresponding to those of FIG. 8, in accordance with various aspects and implementations of the subject disclosure.

FIGS. 8-11 show results obtained via electromagnetic simulations. The plot of FIG. 8 demonstrates capacitance change with increase in frequency, while the plot of FIG. 9 demonstrates Q-factor change (normalized to one) with increase in frequency. In FIGS. 8 and 9, the solid lines 880 and 990, respectively, represent changing the capacitance via a simulated capacitor (by changing the capacitor's overlapping area) rather than using an enlarged interconnect area as in FIG. 5A. The dashed lines 882 and 992 in FIGS. 8 and 9, respectively, represent changing the capacitance by changing the capacitor's overlapping area rather than using an enlarged interconnect area as in FIG. 5B. The dotted-and-dashed lines 884 and 994 in FIGS. 8 and 9, respectively, represent changing the capacitance by changing the capacitor's overlapping area rather than using an enlarged interconnect area as in FIG. 6A. The dotted lines 886 and 996 in FIGS. 8 and 9, respectively, are of a conventional capacitor as in the upper portions of FIGS. 1 and 2.

As can be seen from FIGS. 8 and 9, which show the electromagnetic simulation response of four traditional capacitors by changing the capacitance through a physical overlapping area change, the effect of resonance frequency change and its connection highlight some change in SRF and Q-factor. FIG. 9 shows a clear indication of Q-factor reducing to zero (0) at the self-resonance frequency, and the changing in capacitor value (FIG. 8) with frequency, which is expected. The region of interest (ROI) or the usable range of such capacitors is significantly limited, as high value capacitors have low SRF.

In contrast, with the technology described herein, the SRF and Q-factor are able to be controlled without changing the capacitor size, manufacturing process and/or materials. As described herein, the technology can be used with any arbitrary shape of MIM capacitor and not just limited to a circular/semicircular overlapping area. The technique can be used on standard two-layer MIM capacitors that includes M1 and M2, or with a multilayer MIM capacitor, which can potentially include multiple metal conductor layers to reduce the overall area of the device.

Figure 10:
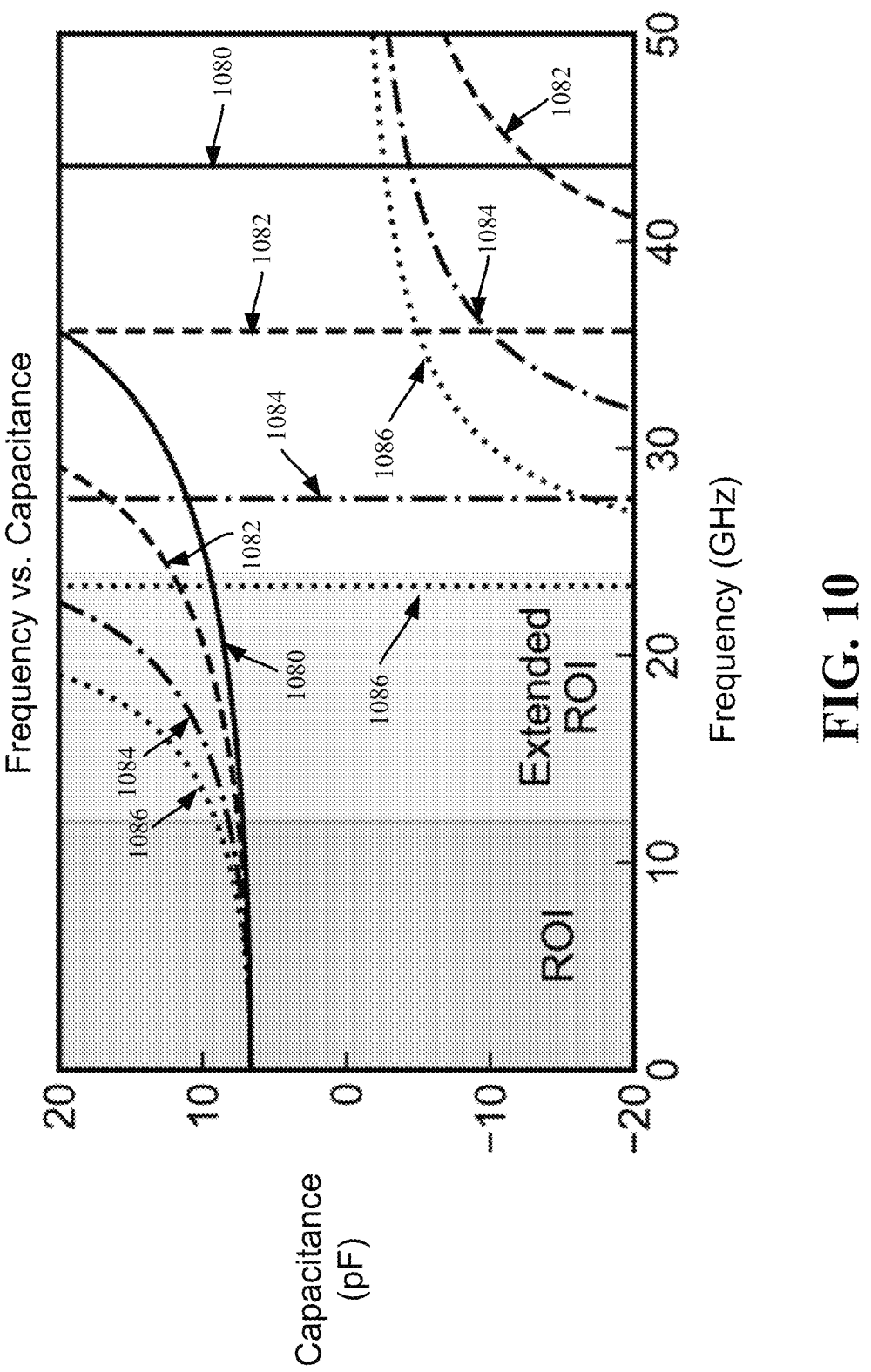
FIG. 10 is an example graph of capacitance versus frequency for the example modified capacitive devices as generally represented in FIGS. 5A, 5B, 6A and 6B, in accordance with various aspects and implementations of the subject disclosure.
Figure 11:
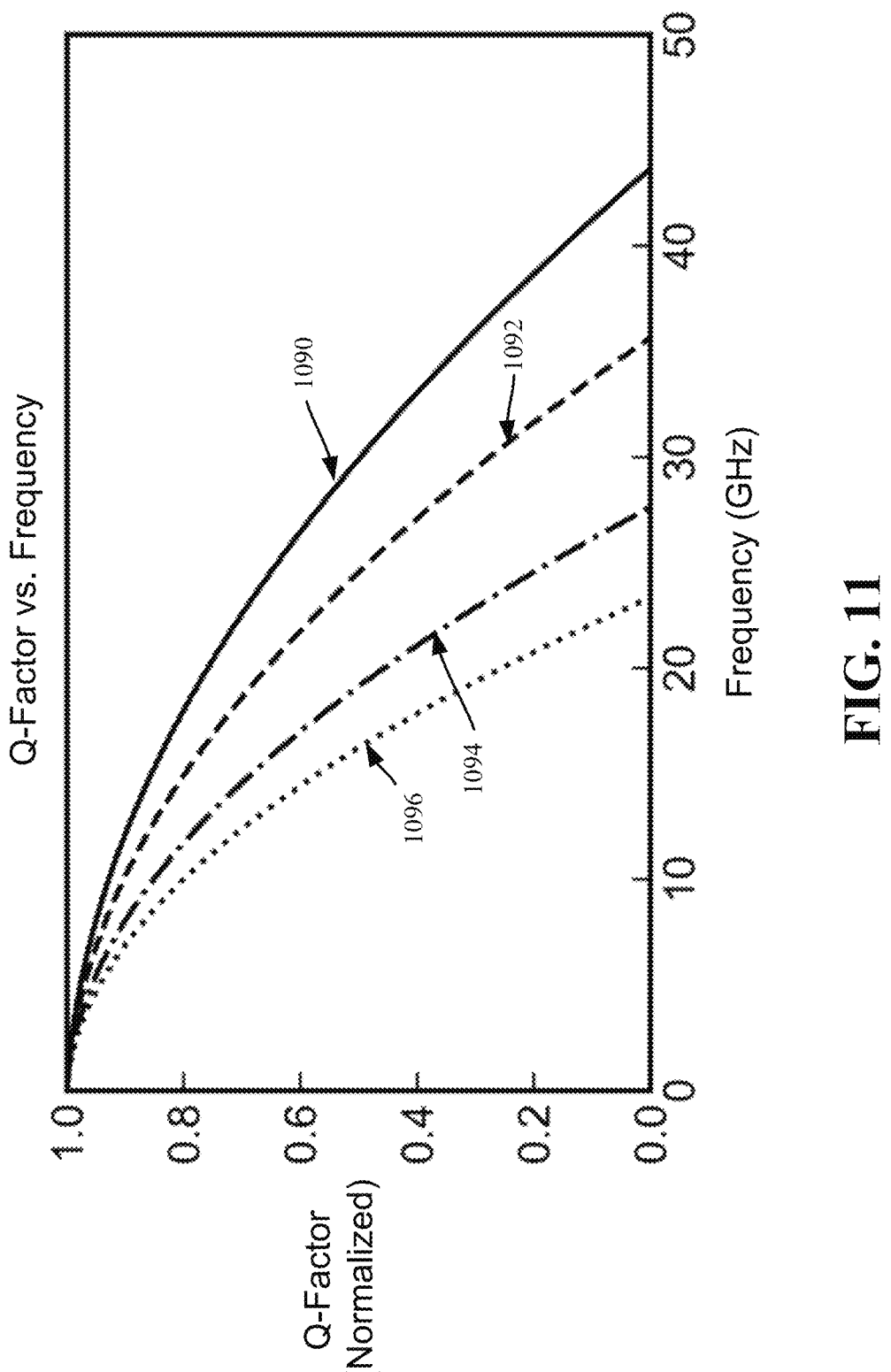
FIG. 11 is an example graph of quality factor (Q-factor) versus frequency for the example modified capacitive devices as generally represented in FIGS. 5A, 5B, 6A and 6B, in accordance with various aspects and implementations of the subject disclosure.

FIGS. 10 and 11 show the electromagnetic simulation response of capacitor versus frequency and the respective Q-factor for the different design variations of FIGS. 5A, 5B, 6A and 6B. In FIGS. 10 and 11, the solid lines 1080 and 1090, respectively, represent the design of FIG. 5A with the most interconnect area coverage. The dashed lines 1082 and 1092 in FIGS. 8 and 9, respectively, represent the design of FIG. 5B with the approximately seventy-five percent interconnect area coverage. The dotted-and-dashed lines 1084 and 1094 in FIGS. 8 and 9, respectively, represent the design of FIG. 6A with the approximately forty percent interconnect area coverage. The dotted lines 1086 and 1096 in FIGS. 8 and 9, respectively, represent the design of FIG. 6B.

The plots of FIGS. 10 and 11 clearly show that for a certain capacitor value, changing the design parameter enhances the SRF and Q-factor without affecting the capacitor value at higher frequencies. As can be seen, MIM capacitor can be made more optimal by carefully and/or selectively arranging the interconnects or to obtain a desirable SRF of a capacitor based on a given application. Relative to FIGS. 8 and 9, the SRF of FIG. 10 and normalized Q-factor of FIG. 11 shows more than a two-times increase in both parameters without any significant impact on the capacitor value including in the extended region of interest corresponding to frequencies over twenty gigahertz (that is, up to approximately 25 GHz). By tweaking the number of interconnects or the percent of electric interconnect wall between two metal plates, a precisely controlled SRF and Q-factor can be achieved with this technology described herein.

Some non-limiting usage examples of the capacitors based on the technology described herein include impedance matching networks (IMN), or simply impedance tuners, which are needed on user equipment devices (UEs) and base stations. Impedance matching networks utilizing various different technologies are integrated in a wide range of commercial wireless communication devices. Impedance matching networks compensate for the antenna impedance variations that arise within a radio frequency front end due to switching of frequency bands of operation, e.g., when a UE moves between different cellular frequency bands, switching from 4G LTE to 5G network, switching between cellular and Wi-Fi nodes, and the like. Impedance matching networks can also adapt dynamically with variations in output RF power levels, temperature, orientation of the UE, and process deviations as these networks ensure highest system efficiency and optimum power transfer.

Typically, impedance matching networks are developed by having switches integrated with a wide variety of fixed MIM capacitors, or by having some sort of variable capacitance. A large value of stable MIM capacitors, including with high SRF and high Q-factor as described herein, provide a large tuning range such that a single impedance matching network can perform better than integrating multiple impedance matching networks for different tuning range.

Thus, impedance matching networks are needed in a wide range of RF equipment; a fundamental element of impedance matching networks are capacitors. High performance MIM capacitors as described herein facilitate developing impedance matching networks that can not only be used in 5G or mmWave radio equipment, but also in a large variety of consumer electronics such as notebooks, tablets, and other UE devices.

Another usage example for high SRF and high Q-factor capacitors as described herein is in reflective type phase shifters for beamforming. Phase shifters play an important role in the modern phased array systems' performance to provide a wide RF phase tuning range with low transmission loss. Phased arrays are used for beamforming, which is significant in 5G and mmWave communications, because it provides for directional transmission or reception of signals.

While antennas are fixed elements on a printed circuit board or other substrate, their radiation pattern can be tuned by providing an electronic phase shift by including a phase shifter just before the antenna elements. There are various methods to provide phase shift, but effective ones include reflective type phase shifters (RTPS). For monolithically integrated phased array systems for beamforming, reflective type phase shifters provide high phase shift resolution due to their small size and circuit topology. The most common designs of reflective type phase shifters utilize a hybrid couple with two LC (inductor-capacitor) reflection loads. Hybrid couplers are fixed for a certain frequency band, but the range of phase tuning depends on how much capacitance tuning can be achieved from a reflective load. With a range of capacitance, a small phase shift is achieved, but the range can only be extended by adding a large number of LC sections; however, the phase shift range saturates. A more optimal way to increase the phase shift range is to have higher value capacitors with large SRF as described herein, because a large value of capacitance range reduces the number of sections, which keeps the circuit size small, and allows faster tuning, because a larger number of elements require a large number of switching elements. A single element also provides better reliability.

Capacitors with SRF below the frequency band of interest should not be used, because the capacitive reactance would behave like an inductance reactance, forfeiting the whole circuit design and can potentially damage the antenna elements. MIM capacitors with high capacitance values having SRF beyond operational frequency band allow developing phase shifters having a large tuning range in a small area. Such phase shifters can be used in 5G infrastructure including but not limited to UE, radio units, 5G intelligent beamforming, mmWave consumer devices such as laptops.

One or more aspects can be embodied in a capacitor device, such as described and represented in the drawing figures herein. The capacitor device can include a first conductor, a second conductor, and a dielectric layer between the first conductor and the second conductor. The dielectric layer can be coupled to a physical interconnect overlapping area to facilitate electrical surface current flow between the first conductor and the second conductor, in which the physical interconnect overlapping area is configured to determine a resonance frequency of the capacitor device.

The physical interconnect overlapping area can be positioned proximate to a periphery of a radio frequency ground plane of the capacitor device.

The physical interconnect overlapping area can include a single elongated via proximate to part of a periphery of the first conductor, in which the single elongated via determines an overall size of the physical interconnect overlapping area.

The physical interconnect overlapping area can be substantially centered substantially opposite a signal port of the capacitor device.

The physical interconnect overlapping area can include a group of respective conducting interconnects as respective vias that determine an overall size of the physical interconnect overlapping area. The respective conducting interconnects can be distributed in a circular or substantially circular pattern. The respective conducting interconnects can be distributed proximate to a periphery of the first conductor. The respective conducting interconnects can be distributed proximate to less than one half of a periphery of the first conductor. The respective conducting interconnects can be distributed proximate to more than one half of a periphery of the first conductor.

One or more aspects can be embodied in a device, such as represented herein. The device can include a first conductor electrode separated from a second conductor electrode by a dielectric medium to operate as a metal-insulator-metal capacitor with a radio frequency ground plane. The device can further include a physical interconnect overlapping area aligned with a periphery of the radio frequency ground plane to facilitate electrical surface current flow between the first conductor and the second conductor to reduce a surface current density of the metal-insulator-metal capacitor, in which a resonance frequency of the capacitor device is based on a size of the physical interconnect overlapping area.

The first conductor electrode can extend to cover the radio frequency ground plane.

The physical interconnect overlapping area can include a geometrically distributed array of interconnects that enables electrical vias from the first conductor electrode to the second conductor electrode through the dielectric medium.

The dielectric medium can be a first dielectric medium, and the device can further include a third conductor electrode separated from the second conductor electrode by a second dielectric medium.

The metal-insulator-metal capacitor can operate with substantially stable capacitance with frequencies ranging from about one gigahertz to about twenty gigahertz.

One or more aspects can be embodied in a capacitor, such as described and represented herein. The device can include a first conductor overlapping with a dielectric layer, the dielectric layer overlapping with a second conductor, the first conductor electrically coupled to the second conductor via an array of interconnects through the dielectric layer; the array of interconnects facilitates electrical surface current flow between the first conductor and the second conductor, and determines self-resonant frequency of the capacitor. The second conductor can be coupled to a substrate.

The first conductor can extend over at least a portion of a radio frequency ground plane associated with the capacitor.

The array of interconnects can include a geometrically distributed array.

The array of interconnects can be positioned proximate to a periphery of the first conductor.

The capacitor can be useable as a tuning element as part of an impedance matching network.

The capacitor can be a part of a millimeter wave frequency phase shifter for antenna elements.

As can be seen, there is provided a capacitor technology for capacitors with high self-resonant frequency and Q-factor for use in high frequency (e.g., RF) applications. Advantages compared to other known solutions include more stable capacitance at higher (e.g., mmWave) frequencies. Further, the technology can be implemented with straightforward design modifications, e.g., a design tweak at the device layout level, to improve the SRF and Q-factor of planar capacitors independent of the capacitor value, that is, the technology described herein desirably enhances the self-resonance frequency and Q-factor of planar capacitors without affecting each capacitor's intrinsic value.

The technology described herein his can be seamlessly integrated during the layout phase, obviating the need for manufacturing modifications. This allows industries to develop and manufacture miniaturized high performance monolithic MIM capacitors with high capacitance values independent of material stack changes or any heterogeneous integration using vendor components. Having co-dependent control of Q-factor and SRF change without impacting the capacitor value provides flexibility in tuning RF components, and thus extends the usable range of the component towards high frequencies, without any additional material inclusions, providing applicability into the mmWave spectrum.

What is described above includes mere examples. It is, of course, not possible to describe every conceivable combination of components, materials or the like for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A capacitor device, comprising:
a first conductor;
a second conductor; and a dielectric layer between the first conductor and the second conductor, the dielectric layer coupled to an interconnect overlapping area to facilitate electrical surface current flow between the first conductor and the second conductor, wherein the interconnect overlapping area is configured to determine a resonance frequency of the capacitor device, and wherein the interconnect overlapping area comprises a single elongated via, and wherein the single elongated via determines an overall size of the interconnect overlapping area.

2. The capacitor device of claim 1, wherein the interconnect overlapping area is positioned proximate to a periphery of a radio frequency ground plane of the capacitor device.

3. The capacitor device of claim 1, wherein the interconnect overlapping area is substantially centered substantially opposite a signal port of the capacitor device.

4. The capacitor device of claim 1, wherein the single elongated via determines an overall size of the interconnect overlapping area.

5. The capacitor device of claim 1, wherein the single elongated via is shaped in a circular or substantially circular shape.

6. The capacitor device of claim 1, wherein the single elongated via is proximate to a periphery of the first conductor.

7. The capacitor device of claim 1, wherein the single elongated via is proximate to less than one half of a periphery of the first conductor.

8. The capacitor device of claim 1, wherein the single elongated via is proximate to more than one half of a periphery of the first conductor.

9. A device, comprising:

a first conductor electrode separated from a second conductor electrode by a dielectric medium to operate as a metal-insulator-metal capacitor with a radio frequency ground plane; and an interconnect overlapping area aligned with a periphery of the radio frequency ground plane to facilitate electrical surface current flow between the first conductor and the second conductor to reduce a surface current density of the metal-insulator-metal capacitor, wherein a resonance frequency of the capacitor device is based on a size of the interconnect overlapping area, wherein the interconnect overlapping area comprises a single via proximate to part of a periphery of the first conductor, wherein the single via covers at least a threshold large area with respect to current flow between the conductors, and wherein the single via determines an overall size of the interconnect overlapping area.

10. The device of claim 9, wherein the first conductor electrode extends to cover the radio frequency ground plane.

11. The device of claim 9, wherein the interconnect overlapping area enables electrical vias from the first conductor electrode to the second conductor electrode through the dielectric medium.

12. The device of claim 9, wherein the dielectric medium comprises a first dielectric medium, and wherein the device further comprises a third conductor electrode separated from the second conductor electrode by a second dielectric medium.

13. The device of claim 9, wherein the metal-insulator-metal capacitor operates with substantially stable capacitance with frequencies ranging from about one gigahertz to about twenty gigahertz.

14. A capacitor, comprising:

a first conductor overlapping with a dielectric layer, wherein the dielectric layer overlaps a second conductor, wherein the first conductor is electrically coupled to the second conductor via a single elongated interconnect through an interconnect area of the dielectric layer, and wherein the interconnect area is configured to:

facilitate electrical surface current flow between the first conductor and the second conductor, and determine a self-resonant frequency of the capacitor, wherein the interconnect area is substantially centered substantially opposite a signal port of the capacitor.

15. The capacitor of claim 14, wherein the first conductor extends over at least a portion of a radio frequency ground plane associated with the capacitor.

16. The capacitor of claim 14, wherein the single elongated interconnect is positioned proximate to a periphery of the first conductor.

17. The capacitor of claim 14, wherein the capacitor is useable as a tuning element as part of an impedance matching network.

18. The capacitor of claim 14, wherein the capacitor comprises a part of a millimeter wave frequency phase shifter applicable to an antenna element.

19. The capacitor device of claim 1, wherein the capacitor device is comprised in an antenna element.

20. The device of claim 9, wherein the interconnect area is substantially centered substantially opposite a signal port of the capacitor device.

* * * * *